United States Patent [19]
McBride et al.

[11] Patent Number: 4,908,689
[45] Date of Patent: Mar. 13, 1990

[54] ORGANIC SOLDER BARRIER

[75] Inventors: Donald G. McBride, Binghamton, N.Y.; Jane M. Shaw, Ridgefield, Conn.

[73] Assignee: International Business Machines Corporation

[21] Appl. No.: 213,434

[22] Filed: Jun. 27, 1988

Related U.S. Application Data

[63] Continuation of Ser. No. 860,261, May 6, 1986, abandoned.

[51] Int. Cl.⁴ .................... H01L 23/14; H01L 23/18; H01L 23/12
[52] U.S. Cl. ....................................... 357/67; 357/80; 357/68
[58] Field of Search ...................... 357/67, 54, 73; 67, 357/68, 71, 14, 80; 148/137; 437/229

[56] References Cited

U.S. PATENT DOCUMENTS

| | | | |
|---|---|---|---|
| 3,373,323 | 3/1968 | Wolfrum et al. | 357/14 |
| 3,392,442 | 7/1966 | Napier et al. | 357/71 |
| 3,495,133 | 2/1970 | Miller | 357/67 |
| 3,668,025 | 6/1972 | Blum et al. | 357/67 |
| 4,328,262 | 5/1982 | Kurahashi et al. | 357/54 |

OTHER PUBLICATIONS

Cortellino et al.—"Dielectric Sputtering for Multilayer Circuitry"—IBM Technical Disclosure Bulletin—vol. 14, No. 2, Jul. 1971, p. 429.

*Primary Examiner*—Rolf Hille
*Assistant Examiner*—S. V. Clark
*Attorney, Agent, or Firm*—Sughrue, Mion, Zinn, Macpeak & Seas

[57] ABSTRACT

A system for defining a solder barrier using a silylated positive photoresist. This layer replaces the top chrome layer previously employed and defines the C4 and I/O select patterns. The personality pattern in the Cr-Cu layers is defined by the use of a positive photoresist which is etched to provide the copper etch mask. The etched copper is then used to etch the chrome. This avoids the incompatibility of the positive photoresist with the alkaline chromium etchant.

6 Claims, 1 Drawing Sheet

ORGANIC SOLDER BARRIER

This is a continuation of Ser. No. 860,261, filed 5/6/86, now abandoned.

TECHNICAL FIELD

This invention relates to a process for defining a solder barrier utilizing a silylated photoresist. In joining a semiconductor chip to a substrate, a solder joint is employed to provide the necessary electric coupling between the microminiature semiconductor component and terminal metallurgy on the substrate surface. This invention is directed to a process and the resulting structure of employing a high temperature organic solder dam to isolate the terminal area on the substrate from the overflow of solder during the joining operation.

BACKGROUND OF THE INVENTION In the manufacture of a semiconductor devices, a number of semiconductor chips are joined to a substrate.

Typically, solder contacts are employed. Such are shown in U.S. Pat. Nos. 3,392,442 and 3,495,133. The solder ball, generally comprising a solder alloy of tin and lead collapses in a controlled manner to provide the necessary connection. During this controlled collapse of the solder ball, it is necessary to provide a stop-off or solder dam to prevent solder material from spreading and typically running down the circuit line.

In the '442 patent, the solder mounds are deposited respectively on a composite of contact metallization which comprises layers of chromium, copper, and gold which are vacuum deposited to provide the desired electrical contact to aluminum land 26. It is recognized in the art that the chromium deposit is necessary to establish the necessary isolation of the contact area such as clearly is illustrated in FIG. 3 of the '442 patent.

Reference is made to IBM Technical Disclosure Bulletin, Volume 16, No. 11, pp. 3610–3611 (Apr. 1974). This TDB discloses techniques of joining semiconductor chips to a substrate by means of a lead-indium solder joint. It is recognized, where controlled collapse chip connections (C4) are employed, isolation of the terminal area is required. Consequently, glass is used in one embodiment, chromium in another, ceramic in a third and silicon dioxide in a fourth implementation of the isolation structure.

In another known process, chromium-copper-chromium blankets are successively deposited onto the substrate. The deposition may be vacuum deposition or sputtering. The first layer of the chromium acts as an adhesion barrier between the copper layer and the ceramic or polyimide forming the substrate material. The intermediate copper layer is the conducting circuit layer as in the case of the '442 patent. The top chromium layer is employed as the solder stop-off or solder dam layer. Thus, as in the case of the '442 patent, this solder dam prevents run off of solder from the solder ball forming the C4 interconnection from contaminating adjacent portions of the substrate. Typically, the solder during collapse tends to run down the circuit line of the chip to be interconnected, thereby ruining that chip. Consequently, as recognized in the art, the top chromium layer is the key to having control collapse of the solder ball in achieving positive chip connection without run-off.

In accordance with this technique and by the extension of that described in the '442 patent, circuitization of the blanket layers, that is chromium-copper-chromium requires two complete photolithographic and etching processes. The first step defines the circuitry, or personalization and the second creates the solder dam. The second step is, therefore, a select etch. The photoresist of choice is currently KTFR. a negative photoresist. Etchant of choice is KMnO$_4$/KOH as a chromium etchant and FeCl$_3$/HCl as the copper etchant.

One of the difficulties in using this choice of materials is the inability of achieving fine line resolution. Another problem is that of stripping. Consequently, within the technology, there exists a limitation on line resolution which may be achieved and, therefore, overall density of the device. The potential use of a positive photoresist would provide a solution. However, a positive photoresist cannot be used because it is incompatible with the use of the top chromium layer. The incompatibility is that when the chrome layer is etched the positive photoresist will also be etched in the same step. Thus, given the use of chromium, the only reliable etchant used to date has been KMnO$_4$/KOH.

Another problem with the use of a negative photoresist such as KTFR is the use of the particular stripping material. J100 is currently employed. This material is considered aggressive and presents environmental and health problems Moreover, it must be used under extremely controlled conditions to prevent yield losses on the product.

Consequently, given the limitations in the technology, the definition of a system which would allow the use of a positive photoresist offers numerous advantages. However, to use standard positive photoresists, the requirement of top level chromium as a solder dam must be eliminated. This is because chromium is etched by basic solutions such as NaOH or KOH which, in use would be destructive to the positive photoresist. Consequently, there existed prior to this invention no technique by which a positive photoresist can be used compatibly with a chromium solder dam layer.

SUMMARY OF THE INVENTION

Given these deficiencies in the prior art, this invention is directed to a technique of depositing a high temperature organic solder dam and to the resulting package structure. This invention employs a silylated photoresist. Such a photoresist comprises a plasma-resistant polymeric material which is prepared by reacting a polymeric material containing reactive hydrogen functional groups with a multifunctional organometallic material containing at least two functional groups which are reactive with the reactive hydrogen functional groups of the polymeric material. Such a material can be hexamethylcyclotrisilazane. A silylated photoresist of this type suitable for this invention is described in detail in U.S. patent application Ser. No. 713,509, entitled "Plasma-Resistant Polymeric Material, Preparation Thereof and Use Thereof" filed on Mar. 19, 1985 by Babich et al. The disclosure of that commonly assigned patent application is expressly incorporated herein by reference.

This invention, therefore, is directed to a specific use of a silylated photoresist as a solder dam layer joining of semiconductor devices to a substrate. This material is used in place of the chromium layer in the C4 process described herein.

In accordance with this invention, a semiconductor substrate is provided with a blanket Cr-Cu deposition. The positive photoresist is then blanket covered over the Cr-Cu layer. The photoresist is then exposed and developed to obtain the necessary personalization. Metallization lines defining the circuitry are then defined by appropriate etching. The positive photoresist is then stripped followed by etching the bottom chromium layer. The solder dam is then created by reapplying a second positive resist pattern which is exposed and developed to provide the C4 and I/0 patterns. The positive photoresist is then silylated and baked. In accordance with this invention, the resulting silylated photoresist is left in place to define the solder barrier.

Using this invention, improved line resolution is attained. Importantly, the requirement for top chromium is eliminated. This in turn reduces the number of processing steps such as top chrome etch which is required in the definition of the solder barrier. Moreover, the process of photoresist stripping is eliminated and this requirement for the use of aggressive and environmentally unsafe material is eliminated.

This invention will be described in greater detail by referring to the attached drawings and the description of the preferred embodiments as follows.

DESCRIPTION OF THE PREFERRED EMBODIMENT

Figure 1:
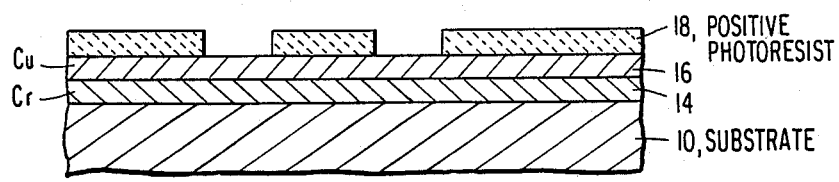
FIGS. 1 through 4 are schematic sectional views illustrating various steps in the process of this invention.

Referring now to FIGS. 1 through 4, the process in accordance with this invention is illustrated. FIG. 1 illustrates a portion of a substrate that has received intermediate processing. As illustrated in FIG. 1 onto a substrate 10 a blanket layer 14 of chromium and a blanket layer 16 of copper are deposited. A positive photoresist 18 is deposited over the chromium copper layers 14 and 16. FIG. 1 illustrates the exposure, development and etching of the positive photoresist 18 to define the personality pattern.

Figure 2:
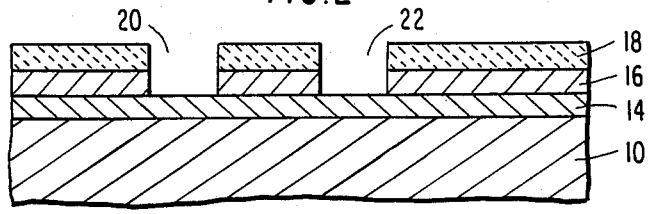

With this intermediate structure then defined, the copper layer 16 is etched with an appropriate copper etchant. Such is illustrated in FIG. 2. Thus, the openings 20 and 22 which define the personality pattern extend through the copper layer 16 and terminate at the chromium layer. An appropriate copper etchant is FeCl$_3$/HCl, CuCl$_2$ or the like. Following this definition of the personality pattern the photoresist is stripped away with an appropriate stripper. Then, using the etched copper as as mask, the bottom chromium layer 14 is etched in appropriate chromium etchant. Such may be KMnO$_4$/KOH or any appropriate C chromium etchant. Alternatively, the chromium may be etched with the positive photoresist layer in place, that is, immediately following copper etch, but prior to stripping of the resist layer however, the chromium etchant may remove the positive photoresist.

Figure 3:
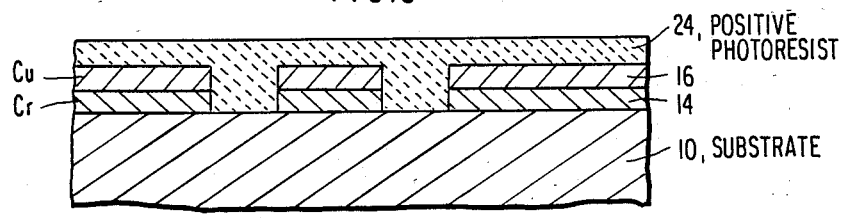
Figure 4:
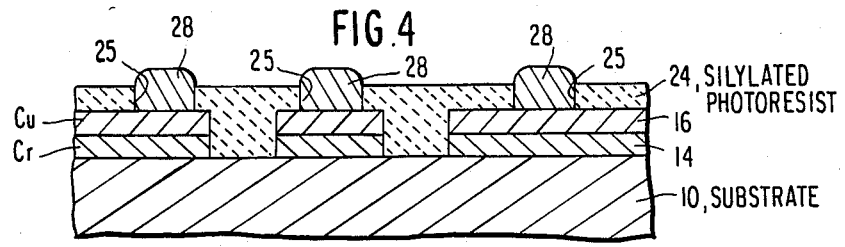

FIG. 3 illustrates the next salient intermediate step in accordance with this invention. The second layer of a positive photoresist 24 is blanketly applied over the copper layer 16 filling the openings 20 and 22. This photoresist 24 is then exposed and developed to provide the select patterning for the C4 solder barriers. I/O patterns and the like. Those openings 25 are illustrated in FIG. 4 as to the select pattern where the solder dams are placed. The positive photoresist is then silylated and baked. This is accomplished in accordance with techniques which are disclosed in the co-pending application Ser. No. 713,509 which has been incorporated herein by reference.

It is noted that the silylated photoresist is left in place as the solder barrier. Processing then occurs in accordance with established techniques such as described in U.S. Pat. No. 3,392,442. That is, solder is deposited into openings 25 via immersion in a molten solder bath or the like. Such is well known in the technology. Alternatively, solder need not be deposited in openings but may be delivered to the interconnection site by the chip. The resulting structure is illustrated in FIG. 4. Next, the chip is joined to the solder connections, that is to the C4 connection 28. This is illustrated in FIG. 5 and represents the final product.

The presence of the silylated photoresist 24 acts as a barrier affirmatively preventing the solder reflow from running down the circuit lines thus causing collapse of the chip which may result in the shorting of the chip to the substrate. As can be appreciated the requirement previously existing in the technology for top chromium is eliminated by this invention. Also, given the use of a positive photoresist fine line resolution capability is achieved.

Figure 5:
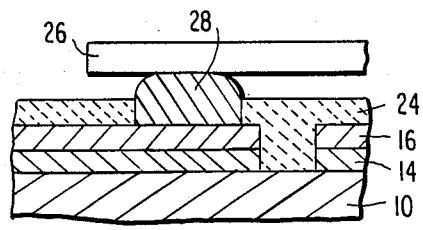
FIG. 5 is a schematic section view of a portion of a completed device illustrating the silylated photoresist in place as a solder dam.

FIG. 5 illustrates the silylated photoresist remaining on the total surface of the substrate. Alternatively, silylated photoresist may be selectively removed once solder barriers are defined by the necessary dams for the C4 and I/O areas. Advantages, however, occur by allowing the silylated photoresist to remain on the top surface. Corrosion protection over both the circuit lines and the bare copper edge of the circuit lines occurs. Additionally, dip tinning is possible because bridging of fine lines will not occur.

It is apparent that other improvements and advantages of this invention will be appreciated and modifications may be practiced without departing from the essential scope of this invention.

We claim:

1. An electrical connection between a semiconductor chip and a carrier, comprising:
   a reflow solder ball contacting said chip and said carrier; and
   a positive photoresist layer comprising a reaction product of a polymeric material containing reactive hydrogen with a silyl group containing multifunctional organometallic material, said layer surrounding said solder ball on the surface of said carrier to act as a solder dam.

2. The electrical connector of claim 1, wherein said layer covers the entire surface of said carrier.

3. The electrical connector of claim 1, wherein said layer covers only conductive circuit lines on the surface of said carrier.

4. An electrical connection between a semiconductor chip and a carrier, comprising:
   a reflow solder ball contacting said chip and said carrier; and
   a silylated positive photoresist layer surrounding said solder ball on the surface of said carrier to act as a solder dam.

5. The electrical connector of claim 4, wherein said silylated positive photoresist covers the entire surface of said carrier.

6. The electrical connector of claim 4, wherein said silylated positive photoresist covers only conductive circuit lines on the surface of said carrier.

* * * * *